United States Patent [19]
Murphy et al.

[11] Patent Number: 4,777,561
[45] Date of Patent: Oct. 11, 1988

[54] ELECTRONIC MODULE WITH SELF-ACTIVATED HEAT PIPE

[75] Inventors: John E. Murphy; William T. Gardner, both of Los Angeles, Calif.

[73] Assignee: Hughes Aircraft Company, Los Angeles, Calif.

[21] Appl. No.: 716,063

[22] Filed: Mar. 26, 1985

[51] Int. Cl.⁴ .................................... F28D 15/02
[52] U.S. Cl. ............................ 361/385; 165/80.4; 361/386
[58] Field of Search ............... 361/381, 382, 383, 384, 361/385, 386; 165/32 H, 104.33, 80.4; 351/82

[56] References Cited

U.S. PATENT DOCUMENTS

| | | | |
|---|---|---|---|
| 3,542,314 | 11/1970 | Bey | 244/163 |
| 3,904,933 | 9/1975 | Davis | 174/15 R X |
| 3,957,107 | 5/1976 | Altoz et al. | 165/32 |
| 4,212,347 | 7/1980 | Eastman | 165/46 |
| 4,330,812 | 5/1982 | Token | 361/386 |
| 4,366,526 | 12/1982 | Lijoi et al. | 361/385 |

FOREIGN PATENT DOCUMENTS

| | | | |
|---|---|---|---|
| 0083538 | 7/1983 | European Pat. Off. | 361/382 |
| 402161 | 1/1976 | U.S.S.R. | 361/386 |
| 1484831 | 9/1977 | United Kingdom . | |

OTHER PUBLICATIONS

Expanding Bellows Cool Electronic Equipment, David J. Bak, Design News, 4-23-84, pp. 124-125.
A New Low Cost Liquid Cooling System For Electronic Hardware, Mrs. D. Hodgins, Proceedings-Institute of Environmental Sciences, 30th Annual Technical Meeting, Orlando, FL, May 1-3, 1984, pp. 1-5.

*Primary Examiner*—Philip H. Leung
*Assistant Examiner*—Morris Ginsburg
*Attorney, Agent, or Firm*—Leonard A. Alkov; A. W. Karambelas

[57] ABSTRACT

A plurality of heat pipes extend longitudinally through a unitary or segmented circuit card module, terminating at both ends in cavities formed along lateral edges of the module. In one embodiment, bellows extend outwardly from the cavities in a direction normal to the plane of the module, terminating in interface plates which extends along the respective lateral edges of the module. In another embodiment, upstanding pillars are connected to bellows covering the cavities. Electronic components are mounted on a circuit card applied to a face of the module. The module is loosely received between opposed liquid cooled surfaces of guiderails in a circuit card rack. Heat from the components is communicated through the card to the heat pipes, increasing the pressure within the pipes to urge the interface plates or pillars into variable pressure contact with the guiderails. The pressure is sufficient to snugly hold the module in the rack. The thermal resistance between the interface plates or pillars and the guiderails varies as a function of the contact pressure, providing fast warm-up and lower operating temperatures for the components.

23 Claims, 5 Drawing Sheets

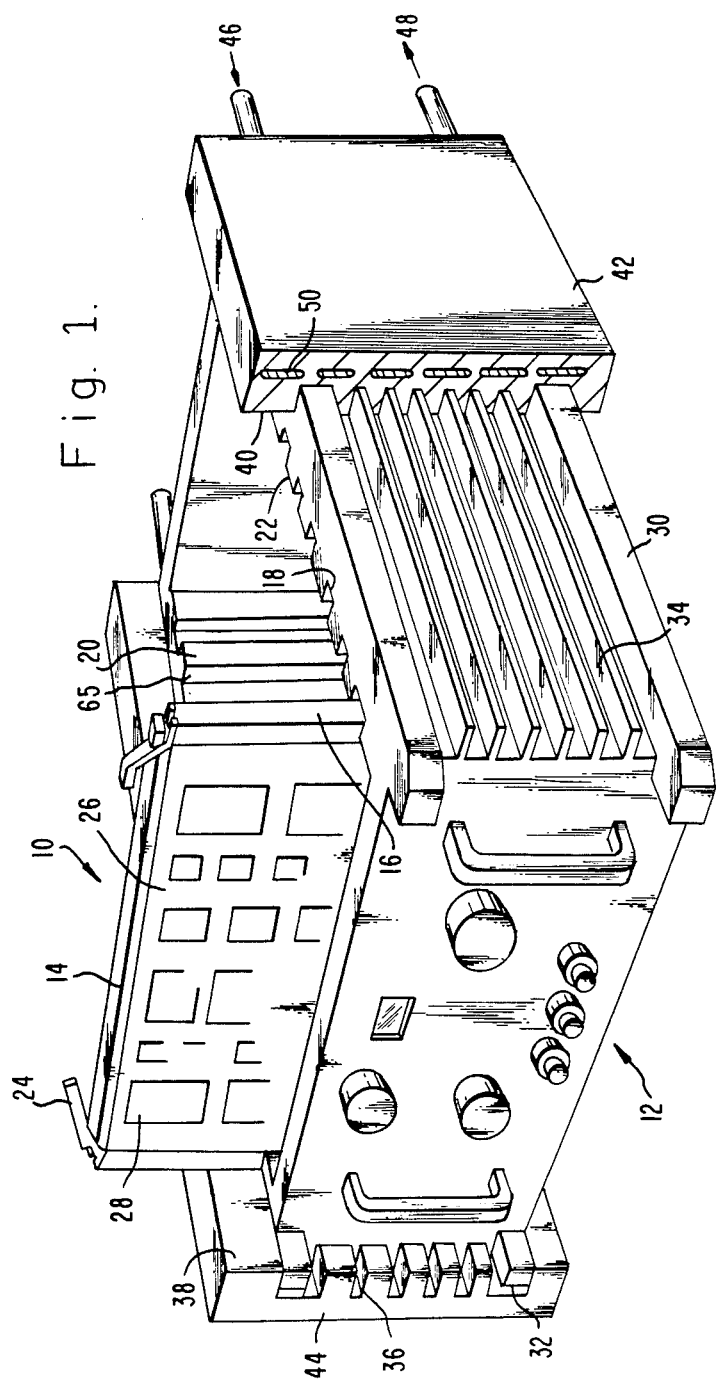

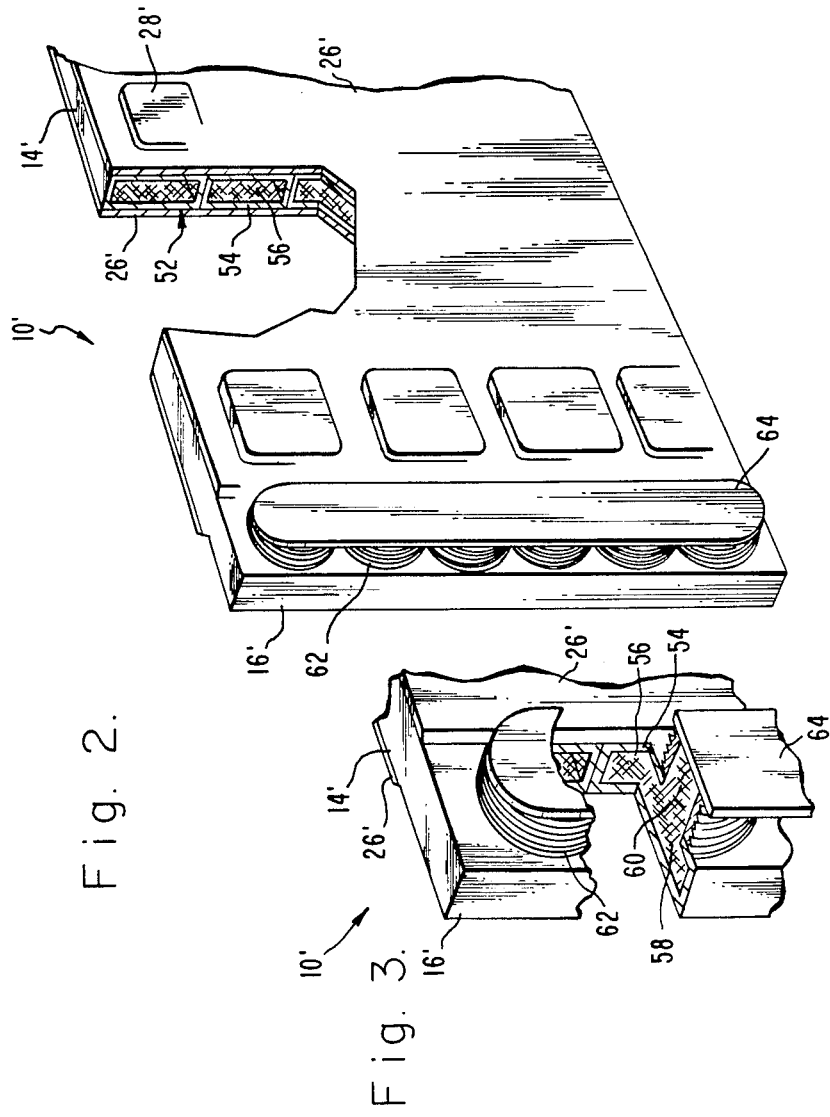

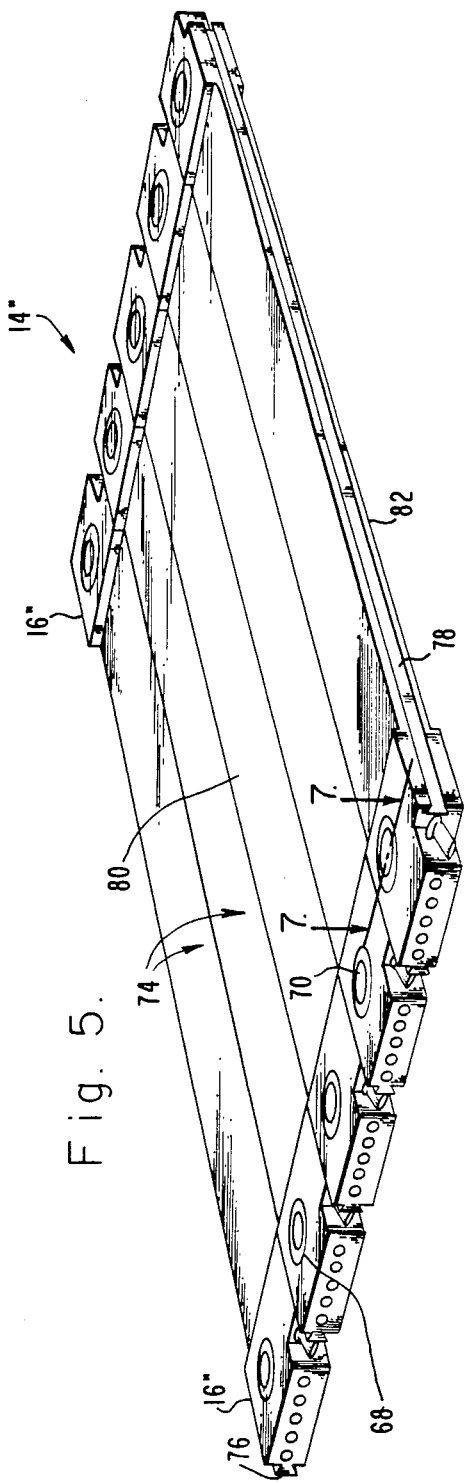

ELECTRONIC MODULE WITH SELF-ACTIVATED HEAT PIPE

BACKGROUND OF THE INVENTION

This invention relates generally to electronic modules and more particularly has reference to the use of a self-activated heat pipe for temperature control and automatic mechanical clamping of electronic modules.

The problem of thermal management becomes exceedingly difficult and complex in advanced avionics systems. Such systems typically include a large number of circuit cards mounted in racks or motherboards in a high density fashion, with each card itself containing a high density of electronic components. Power consumptions as high as 150 watts are common. A high efficiency heat removal scheme must be provided to keep the components at a temperature within the range of 20°-100° C. needed for proper operation.

Older avionics systems were air cooled. Arrays of heat conducting fins were provided in the interiors of the circuit card modules. Air coolant was forced across the fins through openings in the modules to extract heat therefrom. That approach had a number of disadvantages which made it undesirable for use in modern advanced avionics systems. A primary disadvantage was excessive power consumption.

Consequently, the industry has now turned to liquid cooled modules. Such systems typically circulate a liquid coolant through cavities formed in the interior of cold plates which support the circuit card racks. Means are provided for communicating heat from the circuit card components to the interface between the rack and the cold plate, which heat is then absorbed and removed by the liquid coolant flowing through the cold plate.

One technique for communicating heat from the components to the interface is to provide a heat pipe with the circuit cards which absorbs heat from the components. A mechanical clamp is used to attach the cold end of the heat pipe to a portion of the rack in thermal communication with the cold plate. See, for example, U.S. Pat. Nos. 4,366,526 entitled, "Heat-pipe Cooled Electronic Circuit Card" and 4,330,812, entitled "Circuit Board Electronic Component Cooling Structure with Composite Spacer". However, the known heat pipe techniques have proved incapable of keeping the circuit components in the desired temperature range. The components become too hot because the heat flow rate is insufficient to handle the large amounts of heat being generated.

It is well known that the thermal resistance at an interface between two bodies is dependent upon the contact pressure along the interface. As contact pressure increases, thermal resistance decreases to allow greater amounts of heat to flow across the interface. One possible explanation for the deficient heat flow rate in the known cooling systems is that the mechanical clamp connecting the heat pipe to the rack creates insufficient pressure at the pipe/rack interface to reduce the thermal resistance therealong. If that is the case, then means for increasing the contact pressure should provide the necessary heat flow rate and should overcome the problems which exists in the known systems.

Thermal switches have been designed to utilize the varying thermal pressure within an integral heat pipe to create a variable contact pressure between the heat pipe and a temperature regulated body. See, for example, U.S. Pat. No. 3,957,107, entitled, "Thermal Switch". However, those devices have been limited to low heat applications because they produce a maximum contact pressure which is far below that needed for efficient heat removal in high heat applications such as advanced avionics systems. Although insufficient contact pressure can be compensated to some degree by highly polished surfaces along the thermal interface, that approach necessitates costly machining steps. Consequently, such devices have not been used in circuit card modules.

A further problem with the known heat pipe systems for cooling circuit card modules is that the heat flow rate remains fixed at the level used for heat removal during normal operation. That level is higher than needed during a warm-up operation. As a result, excessive heat is removed during warm-up and the circuit components are slow to reach normal operating temperatures. A need thus exists for means to provide a variable heat flow rate, i.e., a heat flow rate which is high during normal operation and which is automatically reduced during warm-up operation.

Advanced avionics systems also present problems of maintenance and reliability. Mechanical clamps are currently used to lock the circuit card modules into the rack. Because each module has its own clamps, the maintenance technician for an advanced avionics system must engage in a time consuming process of inspecting and securing great numbers of clamps. Missed clamps can produce system failure or damage. Special installation tools are usually needed to apply the high closure forces associated with the clamps. In addition to increased tooling and maintenance inventory costs, the use of such tools and clamps has frequently caused breakage of modules during routine maintenance and assembly procedures. Hence, it is readily apparent that a need exists for means to lock the modules into the rack without the use of mechanical clamps or installation tools.

SUMMARY OF THE INVENTION

The present invention overcomes the problems which exist in the prior art.

In the present invention, one or more heat pipes are built into circuit card modules and arranged for thermal communication with the electronic components thereon. The varying internal pressure generated within the heat pipes as heat is absorbed thereby urges an extendable structure outwardly from the module into intimate surface-to-surface contact with a portion of the rack in thermal communication with the liquid cooled cold plate. The contact pressure increases as additional heat is absorbed by the pipes, reducing the thermal resistance across the contact interface and increasing the rate of heat transfer to the cold plate. The extendable structure is constructed and arranged to produce contact pressures capable of achieving a sufficiently low thermal resistance for efficient heat removal from high power, high density avionics modules.

During warm-up operations, the contact pressure remains relatively low because the heat pipes have yet to absorb significant amounts of heat. The resulting high thermal resistance traps heat in the components, causing rapid warm-up.

The modules are designed to initially fit loosely in the rack. As heat from the components is absorbed by the heat pipes, the extendable structure is urged into engagement with the rack under sufficient pressure to effectively lock the modules into the rack. No mechanical clamps are required.

The present invention thus overcomes the deficiencies of the prior art by providing higher contact pressure at the thermal interface, by achieving faster component warm-up from cold start conditions, and by providing a self-activated clamping mechanism which eliminates the need for mechanical clamps and installation tools.

Objects of the invention are, therefore, to provide improved electronic modules and, more specifically, to provide thermal management and mechanical reliability for electronic modules used in advanced avionics systems.

Another object of the invention is to provide improved liquid cooled avionics systems.

A further object of the invention is to implement a self-activated heat pipe in an electronic module for improved thermal management and mechanical reliability and maintainability.

Still another object of the invention is to provide thermal management for an advanced avionics system which reduces aircraft weight and power requirements.

A further object of the invention is to facilitate substitution of liquid cooled modules for air cooled modules in advanced avionics systems.

A further object of the invention is to provide a cooling interface which makes use of a self-activated heat pipe.

Yet another object of the invention is to provide an electronics module capable of rapid warm-up and lower operating temperatures.

Another object of the invention is to provide an electronics module which can be locked into a circuit card rack without mechanical clamps or installation tools.

Yet another object of the invention is to provide an electronic module for use in a mounting structure having a heat sink associated therewith comprising, a body supporting one or more electronic components, heat pipe means associated with said body and in thermal communication with said components for receiving heat therefrom, said heat pipe means containing a heat transfer fluid in a condensation/evaporation cycle for transporting heat from relatively high temperature areas to relatively low temperature areas, and extendable means associated with said body for extension therefrom into variable pressure thermal contact with said heat sink for heat transfer thereto, said extendable means having expandable chamber means in fluid communication with said heat pipe means so that said extension and said variable pressure are controlled by fluid pressure within said heat pipe means.

Still another object of the invention is to provide an electronic module for use in a mounting structure comprising a body supporting one or more electronic components, thermally activated pressure means associated with said body and in thermal communication with said components for receiving heat therefrom, extendable means associated with said body for extension therefrom into pressure contact with said mounting structure, said extendable means being in communication with said pressure means so that said extension is controlled by pressure produced by said pressure means upon receipt of heat from said components, and wherein the body is constructed and arranged to fit loosely in the mounting structure when the extendable means is in a non-extended position, the extendable means and the mounting structure being juxtaposed so that said contact pressure therebetween causes the body to fit snugly in the mounting structure when the extendable means is in an extended position.

These and other and further objects and features of the invention are apparent in the disclosure which includes the above and below specification and claims and drawings.

BRIEF DESCRIPTION OF THE DRAWINGS

FIG. 1 is a perspective view of the electronic module of the present invention in a circuit card rack.

FIG. 2 is a fragmentary, perspective, cutaway view of one embodiment of the electronic module of the present invention.

FIG. 3 is a fragmentary, perspective, cutaway view of a portion of the module shown in FIG. 2.

FIG. 5 is a perspective view of a sub-assembly of the module shown in FIG. 4.

DETAILED DESCRIPTION OF THE PREFERRED EMBODIMENTS

Figure 4:
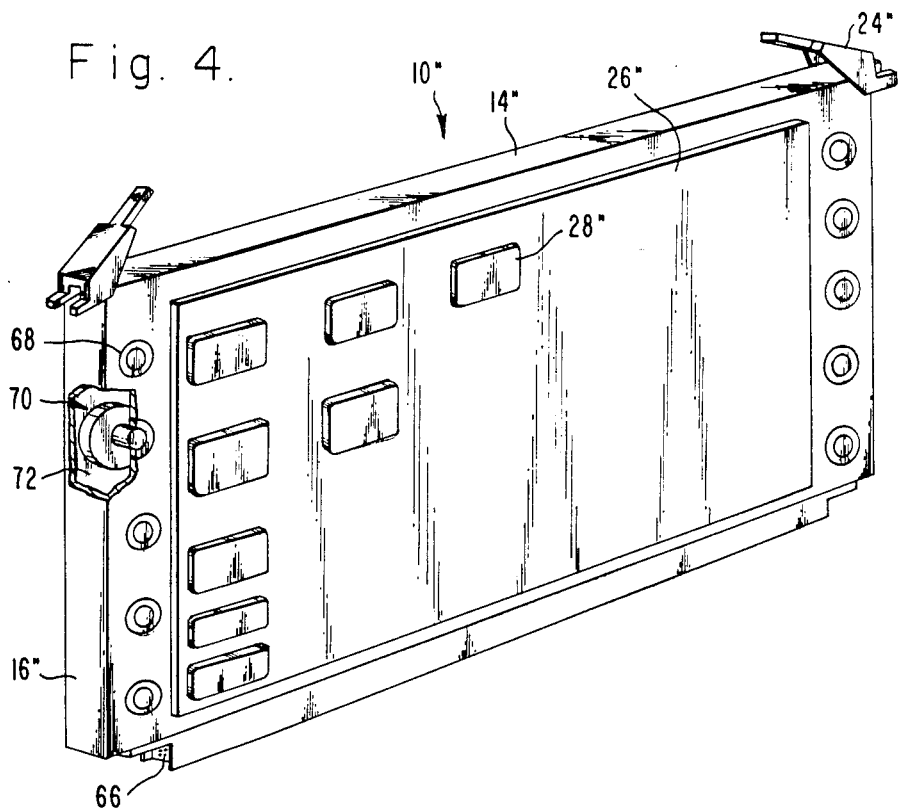
FIG. 4 is a perspective view of another embodiment of the electronic module of the present invention.

Referring to FIG. 1, an electronic module made in accordance with the present invention, indicated generally by the numeral 10, is shown partially inserted into a typical circuit card rack 12 for an advanced avionics system. The module 10 has a planar body 14 with tongue members 16 of generally rectangular cross section extending along the lateral edges. The tongue members 16 are constructed and arranged to be received within vertical grooves or guiderails 18 formed in the interior side surfaces 20 and 22 of the rack 12. Handles 24 provided at remote ends of the upper longitudinal edge of the module 10 facilitate insertion into and removal from the rack 12.

A circuit card 26 containing a plurality of electronic components 28 is mounted on one or both surfaces of the module body 14. Conventional electrical connectors (not shown), such as pin connectors, along the lower longitudinal edge of the module 10 provide electrical communication between the components 28 and a motherboard (not shown) lying along the floor of the rack 12, in a manner well known in the art.

An advanced avionics system typically includes a plurality of racks which are mounted in drawer-like fashion in a support frame forming part of the aircraft structure. Opposed outer side surfaces 30 and 32 of the rack 12 are provided with an array of horizontally extending tongues 34 of generally rectangular cross section which are received within corresponding grooves or guiderails 36 formed in the opposed inner surfaces 38 and 40 of the support frame side members 42 and 44. A liquid coolant (indicated schematically by directional arrows 46 and 48) circulated through interior passageways 50 formed in the side members 42 and 44 causes the members 42 and 44 to function as cold plates which absorb heat from the module 10 and the rack 12.

It will be appreciated that the thermal path for communicating heat from the components 28 to the cold plates 42 and 44 includes the interfaces between the tongue members 16 and rack guiderails 18 and the interfaces between the rack tongues 34 and the cold plate guiderails 36. In prior systems, those interfaces were held together by clamps or bolts or by an interference fit. As a result, the surface-to-surface thermal contact resistance at the interfaces was in the range of about 1.0–1.5 in²°C./watt which did not afford a sufficiently high rate of heat flow to the cold plates to keep the electronic components at proper operating temperatures. The present invention provides a technique for increasing the contact pressure at the interface surfaces to a level sufficient to reduce the thermal interface resistance to about 0.4 in²°C./watt or less, a three-fold improvement which affords an increased heat flow rate to the cold plates and resultant lower operating temperatures for the electronic components.

The foregoing thermal resistance figures for the present invention assume that the interface surfaces are prepared by routine machining operations. The thermal resistance can be reduced even farther with special surface preparations, such as polishing, in a manner well known in the art.

Specific techniques for implementing the present invention at the module/rack interface are described herein. However, the present inention is not limited to the module/rack interface. It will be readily appreciated by persons skilled in the art that the techniques expressly described herein are equally applicable to the rack/cold plate interface. The present invention contemplates all such applications.

FIGS. 2 and 3 show a simple embodiment which best illustrates the principles of the present invention.

The module 10' is similar to the module 10 shown in FIG. 1. It includes a planar body 14' having tongue members 16' of generally rectangular cross section along the lateral edges. Circuit cards 26' containing a plurality of electronic components 28' are mounted on both sides of the body 14'. For simplicity, the handles and the electrical connectors are not shown.

A plurality of heat pipes 52 extend longitudinally through the interior of the body 14'. The pipes 52 have a conventional structure which includes a conduit 54, preferably made of stainless steel, lined with a wick material 56. A working fluid, preferably Freon 12 or Freon 25, in the conduit 54 goes through an evaporation/condensation cycle to transport heat in a manner well known in the art. Specifically, heat is carried from a location where heat is applied, e.g., the electronic components 28', to a location where heat is removed, e.g., a surface in thermal communication with the cold plates 42 and 44. As heat from the components 28' enters the heat pipes 52, the small amount of working fluid confined in the wick material 56 in a liquid state is boiled. The resulting vapor migrates through the hollow interiors of the conduits 54 toward a location in thermal communication with the plates 42 and 44. Upon contact with the cool surface, the vapor condenses and returns to the location where heat was applied by a mechanism known as capillary pumping. The cycle continues and is self-propagating as long as heat is applied.

The present invention is not directed to heat pipe technology per se. The functional description contained in the preceding paragraph is well known in the art. It will be readily appreciated that the present invention lies in applying heat pipe technology in a new and unobvious way.

Referring to FIG. 3, it can be seen that the conduits 54 terminate in chambers 58 formed throughout the interior of the tongue member 16'. The wick material 56 extends from the conduits 54 and lines the walls of the chamber 58.

Openings 60 are formed at spaced locations along one surface of the tongue member 16'. The number of openings can be varied as desired, but the preferred number is 6. Flexible bellows 62, preferably formed of stainless steel, are welded to the tongue member 16' above each of the openings 60. The bellows 62 have open lower ends to permit the interiors of the bellows 62 to be in communication with the interiors of the chambers 58. The wick material 56 extends through the openings 60 and lines the interiors of the bellows 62. As best shown in FIGS. 2 and 3, the bellows 62 terminate outwardly at an interface sheet 64 which extends along the tongue member 16' and is welded to the closed outward ends of the bellows 62.

Although the preceding descriptions and illustrations of the chambers 58, bellows 62 and interface sheet 64 refer to only one lateral edge of the module 10', it is understood that the remote lateral edge of the module 10' is provided with similar structure.

The circuit cards 26' preferably have a base formed of a copper sheet which not only provides a flat surface for mounting the electronic components 28' but also provides a means for absorbing and evenly distributing heat from the components 28' to the heat pipes 52. The heat is then communicated longitudinally through the heat pipes 52 to the chambers 58 where it continues outwardly through the bellows 62 to the interface sheets 64 which, as shown in FIG. 1, are in thermal communication with the cold plates 42 and 44 through the rack 12.

As the temperature increases within the heat pipes 52, the internal saturation pressure of the working fluid also increases. The increasing fluid pressure expands the bellows 62 and urges the interface sheets 64 outwardly in a direction substantially normal to the plane of the module body 14'. Because the tongue/bellows/interface sheet assemblies 16', 62, 64 of the module 10' are received between the side walls 65 of the rack guiderails 18, extension of the interface sheets 64 from the body 14' urges both the interface sheets 64 and the opposite surfaces of the tongues 16' into contact with the side walls 65 of the guiderails 18 under increasing pressure. That pressure continues to increase as additional heat is received by the heat pipes 52. As the contact pressure increases, the thermal resistance at the contact interface decreases and allows more heat to flow from the heat pipes 52 to the rack 12 and ultimately to the cold plates 42 and 44. Heat is thus removed from the components 28' with greater efficiency, affording them a lower operating temperature.

As mentioned above, it is desirable to obtain a thermal contact resistance of about 0.4 in²°C./watt or less at the contact interface to keep the components in a high density, high power advanced avionics module at an operating temperature of about 20°–100° C., preferably about 50°–70° C., when operating at an input power of up to about 150 watts. To achieve that resistance without highly polished surfaces at the contact interface, it is necessary to generate high pressure, typically 400–900 psi, within the heat pipes. The relationships between internal pressure and various heat pipe design parameters, such as length, diameter and spring rate of bellows, materials used for bellows, conduits and wicks, and the composition and quantity of the working fluid, are well within the skill of the ordinary artisan and thus can be varied as desired to suit particular needs while meeting the subject pressure requirements.

As mentioned above, the contact pressure at the module/rack interface is relatively low when heat is first supplied to the heat pipes 52 and gradually increases as additional heat is supplied. As a result, the thermal resistance at the interface is initially high and the heat tends to remain trapped in the module 10'. That phenomenon is advantageous in that it permits the electronic components 28' to warm-up rapidly from a cold start condition. As the components 28' reach normal operating temperatures, greater amounts of heat are communicated to the heat pipes 52, increasing the contact pressure and decreasing the thermal resistance at the interface to provide a high efficiency transfer of heat to the cold plates 42 and 44 which stabilizes the temperature of the components 28' within their normal operating range.

Figure 8:
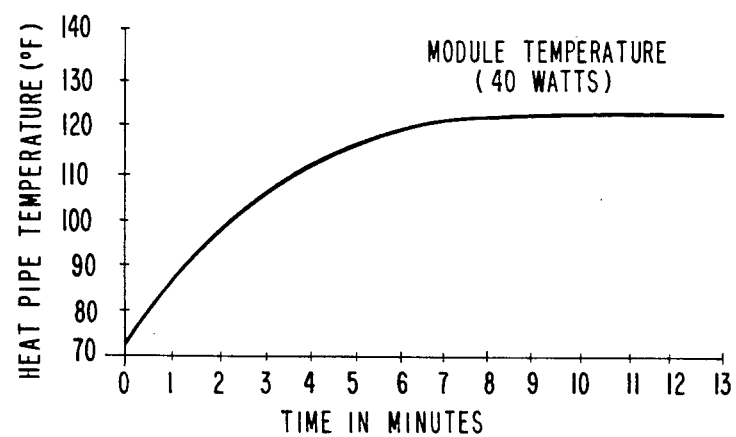
FIG. 8 is a graphical representation of the thermal characteristics of a typical module made in accordance with the present invention.

FIG. 8 shows a graph of temperature versus time for a test module 10' constructed as shown in FIGS. 2 and 3. The module 10' was supplied with an input power of about 40 watts. The temperature in the heat pipe gradually rose from room temperature to about 120° F. in about 7 minutes and then stabilized at that temperature despite continuing input power. The temperature of the electronic components was slightly higher than the temperature of the heat pipe due to thermal losses but generally followed a similar pattern. The graph illustrates the rapid warm-up and the low thermal resistance at operating conditions made possible by the present invention.

In a preferred embodiment, the tongue/bellows interface sheet assemblies 16', 62, 64 are designed to be loosely received between the side walls 65 of the rack guiderails 18 when the interface sheets 64 are in a non-extended position, i.e., when the circuit card 26' is in a cold or non-operative condition. As a result, the module 10' can be easily inserted into the rack 12 without the need for applying high force to the module 10'. As the components 28' heat and cause extension of the interface sheets 64, the sheets 64 and the opposed surfaces of the tongues 16' are urged into contact with the side walls 65 of the guiderails 18 under increasing pressure. The pressure ultimately reaches a level which is sufficient to snugly hold the module 10' in the rack 12 by frictional engagement alone. There is no need for clamps or bolts to keep the module 10' in place.

If necessary, the module 10' can be provided with a heat blanket, such as an inexpensive flat resistor, which is capable of generating heat when the electronic components 28' are in a quiescent state. That heat produces a sufficiently firm engagement between the module 10' and the rack 12 to ensure a good electrical connection between the module 10' and the motherboard for proper commencement of operation of the components 28' and also to ensure that the system will continue to operate properly even in an extremely cold environment such as might be encountered adjacent the exterior surfaces of an aircraft.

The problem of dirt tending to foul the electrical connections when the module 10' is held loosely in the rack 12 can be avoided by keeping the system in a sealed enclosure. Such enclosures are conventional for advanced avionics systems.

When the module 10' is intended for use in a system subject to intense vibration, it may be desirable to preload the bellows so that they attenuate input vibration and do not act as springs which would amplify vibration. Such preloading techniques are well within the skill of the art.

A preferred embodiment of the electronic module of the present invention, which is more amenable to mass manufacturing techniques, is shown in FIGS. 4–7 and indicated generally by the reference number 10". The functional characteristics and advantages of the module 10" are substantially identical to those possessed by the module 10' described above and will thus not be discussed again in detail. The differences reside primarily in the details of structure and the following discussion will be directed to those differences.

Referring to FIG. 4, the module 10" includes a planar body 14" having tongue members 16" of generally rectangular cross section along the lateral edges. Circuit cards 26" containing a plurality of electronic components 28" are mounted on one or both faces of the body 14". Handles 24" are provided at the ends of the upper longitudinal edge of the body 14" to facilitate insertion and removal from the rack 12. A plurality of conventional pin connectors 66 are provided along the lower longitudinal edge of the body 14" and are electrically connected to the circuit card 26" to provide electrical communication between the electronic components 28" and the motherboard (not shown) in the rack 12.

Openings 68 are formed at spaced locations along one face of the tongue members 16" at both lateral edges of the body 14". Extendable pillar assemblies 70, described below in detail, are mounted in chambers 72 formed in the tongues 16" and have portions which project through the openings 68 for engagement with the side walls 65 of the rack guiderails 18 to perform functions similar to those performed by the interface sheets 64 associated with the module 10' of the prior embodiment.

Referring to FIG. 5, it can be seen that the body 14" is made up of a plurality of body segments 74 joined in side-by-side fashion by mating dovetails 76 and grooves 78 formed along opposed longitudinal edges of the segments 74. Each face of the assembly of body segments 74 has a recessed planar central area 80, 82 which receives a circuit card 26".

Figure 6:
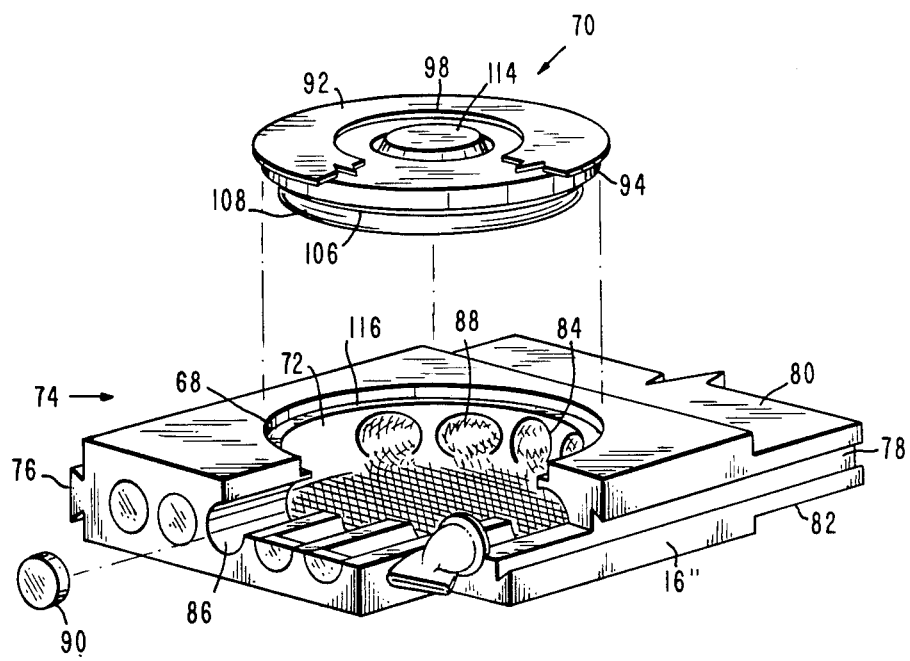
FIG. 6 is an exploded, fragmentary, perspective view of a portion of the structure shown in FIG. 5.
Figure 7:
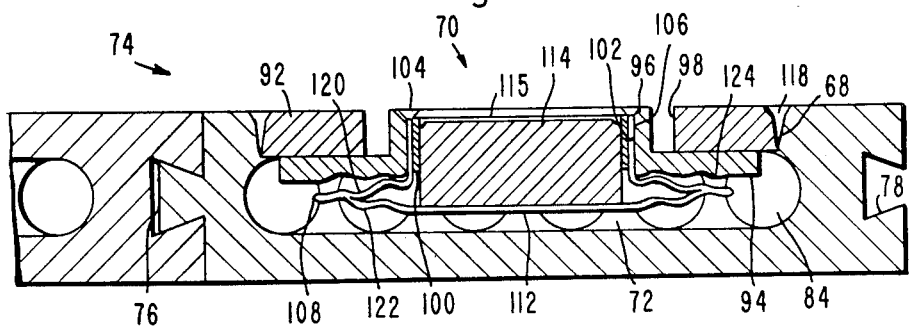
FIG. 7 is a sectional view taken along the line 7—7 in FIG. 5.

Details of the body segments 74 are shown in FIGS. 6 and 7. Although the figures and related descriptions refer to only one end of the segments 74, it is understood that similar structure is provided at both ends of the segments 74.

Referring to FIG. 6, it can be seen that a plurality of heat pipes 84, preferably 6 in number, extend longitudinally through the body segments 74 and terminate at both ends in chambers 72 formed in the end portions of the segments 74 constituting the tongue members 16". For ease of manufacture, the body segments 74, preferably formed of aluminum alloy, are extruded with heat pipes conduits 86 formed longitudinally through the segments 74. The chambers 72 are formed by hogging out the interior of the ends of the segments 74. Wick material 88, preferably 0.020–0.030 stainless steel, lines the interior walls of the heat pipes 84 and the chambers 72. The extendable pillar assemblies 70 are inserted through the openings 68 and mounted in the chambers 72 by welding. The ends of the conduits 86 are sealed with plugs 90 to prevent escape of the working fluid, preferably pure ammonia.

Details of the extendable pillar assemblies 70 are best understood by reference to FIGS. 6 and 7.

The lower surface of a circular cap 92, preferably formed of aluminum alloy, is connected to the upper surface of an L-section ring 94, preferably formed of stainless steel, by inertia welding. The upstanding portion 96 of the ring 94 extends through an opening 98 of larger radius formed in the center of the cap 92 and terminates flush with the outer surface of the cap 92. A cylindrical guide 100, preferably formed of stainless steel, is received in the hub 102 defined by the upstanding portion 96 of the ring 94 and attached thereto by a circumferential TIG weld 104. The upstanding cylindrical end 106 of a sealed, single coil bellows 108, preferably formed of stainless steel, is held between the guide 100 and the upstanding portion 96 of the ring 94 by an interference fit. A cylindrical pillar 114, preferably formed of stainless steel, is mounted on the rigid base 112 of the bellows 108 and extends upwardly therefrom to be slidingly received within the guide 100.

When a pillar assembly 70 is inserted through an opening 68 in a body segment 74, the bellows 108 and pillar 114 enter the chamber 72 and the lower surface of the cap 92 extending beyond the ring 94 comes to rest upon a lip 116 formed along the lower edge of the opening 68. The pillar assembly 70 is permanently connected to the body segment 74 by a circumferential electron beam weld 118 between the cap 92 and the side wall of the opening 68.

Operation of the module 10" can now be readily understood.

Heat generated by the electronic components 28" is communicated through the conduit card 26" to the plurality of heat pipes 84 extending longitudinally through each of the interlocking segments 74 making up the the body 14". Heat flows through the pipes 84 to the chambers 72 at the ends of the segments 74 and is then communicated to the pillars 114. As additional heat is received by the heat pipes 84, the internal saturation pressure of the working fluid increases. The pressure acts against the bellows 108 to urge the pillars 114 outwardly through the guides 100. The outward end surfaces 115 of the pillars 114, which are initially flush with the surface of the body 14", extend outwardly therefrom into pressure contact with the side walls 65 of the rack guiderails 18. As contact pressure between the pillars 114 and the guiderails 18 increases, the thermal resistance at the interface therebetween decreases to permit a high rate of heat flow from the pillars 114 to the cold plates 42 and 44. The modules 10", which are loosely received in the guiderails 18 when the end surfaces 115 of the pillars 114 are flush with the surface of the module body 14", become snugly locked into the rack 12 as the pillars 114 extend outwardly into high pressure frictional engagement with the side walls 65 of the guidrails 18. The variable contact pressure between the pillars 114 and the guiderails 18, ranging from low when heat is first applied to the heat pipes 84 to high after the pipes 84 have received a substantial amount of heat, produces an inverse variation in thermal resistance between the module 10" and the rack 12 which results in rapid warm-up characteristics of the type described with reference to the module 10' of the prior embodiment.

The upper and lower parts 120 and 122 of the flexible portion of the bellows 108 have mating wave-like shapes which substantially conform to the wave-like shape of the lower surfaces of the rings 94. As the bellows 108 contract under fluid pressure from the heat pipes 84, the mating surfaces 118, 120 and 122 engage each other to act as a mechanical limit or stop on the travel of the pillars 114. By proper design of the stopping action, the fluid pressures within the chambers 72 can be increased to the desired levels.

Although the invention has been described thus far solely in terms of its applicability to an electronic module, and more specifically to an electronic module for use in an advanced avionics system, it will be appreciated by persons skilled in the art that the invention is not limited thereto but can be used in a wide variety of applications requiring thermal management and/or self-actuated clamping. The scope of the invention should be construed to encompass all of those applications and embodiments.

While the invention has been described with reference to specific embodiments, the exact nature and scope of the invention is defined in the following claims.

What is claimed is:

1. Electronic module apparatus for use in a mounting structure having a heat sink associated therewith comprising:
   a body supporting one or more electronic components;
   heat pipe means associated with said body and in thermal communication with said components for receiving heat therefrom;
   said heat pipe means containing a heat transfer fluid in a condensation/evaporation cycle for transporting heat from relatively high temperature areas to relatively low temperature areas; and
   said body having extendable means for extension therefrom into contact with said heat sink for heat transfer thereto, said extendable means having expandable chamber means in fluid communication with said heat pipe means so that said extension is controlled by fluid pressure produced within said heat pipe means by receipt of heat from said components, said body being constructed and arranged to fit loosely in the mounting structure when the extendable means is in a non-extended position, the extendable means being constructed and arranged to juxtapose to said heat sink so that said contact therebetween causes the body to fit snugly in the mounting structure when the extendable means is in an extended position.

2. The apparatus of claim 1 wherein the heat pipe means are located in an interior of the body.

3. The apparatus of claim 1 wherein the expandable chamber means comprise bellows.

4. The apparatus of claim 3 further comprising means for restricting travel of the bellows in a manner to increase fluid pressures therein.

5. The apparatus of claim 1 wherein the body comprises a planar member, the extendable means being connected to the member for extension outwardly therefrom in a direction substantially normal to the plane of the member.

6. The apparatus of claim 5 wherein the heat pipe means comprise a plurality of heat pipes extending longitudinally across the member and the expandable chamber means comprise a plurality of bellows located adjacent lateral edges of the member.

7. The apparatus of claim 6 wherein the bellows are connected to interface means positioned along the lateral edge of the member for contact with said heat sink.

8. The apparatus of claim 5 wherein the expandable chamber means comprises bellows located adjacent remote lateral edges of the member which are conected to interface means positioned along the respective lateral edges, said lateral edges and interface means being constructed and arranged to be loosely received between opposed surfaces of guiderails on the mounting structure when the extendable means is in a non-extended position, extension of the extendable means urging the interface means and the lateral edges into contact with said opposed surfaces under sufficient pressure to snugly hold the body in the mounting structure.

9. The apparatus of claim 1 wherein the expandable chamber means comprises cavity means formed in the body in fluid communication with the heat pipe means for receiving fluid pressure therefrom and bellows means closing the cavity means for moving with respect to the body in response to said fluid pressure.

10. The apparatus of claim 10 wherein upstanding pillar means are connected to the bellows means.

11. The apparatus of claim 10 wherein the pillar means is received within an opening formed in the body when the extendable means is in a non-extended position.

12. The apparatus of claim 1 wherein the heat transfer fluid is selected from the group consisting of pure ammonia, Freon 12 and Freon 25.

13. The apparatus of claim 1 wherein a copper sheet is interposed between the body and the components for transferring heat from the components to the heat pipe means.

14. The apparatus of claim 1 wherein said fluid pressure is sufficient to obtain a thermal resistance of about 0.4 in$^2$°C./watt or less at the contact between the expandable chamber means and the heat sink.

15. The apparatus of claim 1 wherein the extendable means is constructed and arranged to provide a contact with the heat sink having a thermal resistance which varies as a function of said fluid pressure within the heat pipe means.

16. The apparatus of claim 1 wherein the body comprises a plurality of interconnected segments, each segment being provided with independent heat pipe means.

17. The apparatus of claim 1 wherein mating pin connector means are provided on the body and the mounting structure for providing electrical communication therebetween.

18. Electronic module apparatus for use in a mounting structure having a heat sink associated therewith comprising;
   a body supporting one or more electronic components;
   heat pipe means associated with said body and in thermal communication with said components for receiving heat therefrom;
   said heat pipe means containing a heat transfer fluid in a condensation/evaporation cycle for transporting heat from relatively high temperature areas to relatively low temperature areas; and
   said body having extendable means for extension therefrom into pressure contact with said heat sink for heat transfer thereto, said extendable means having expandable chamber means in fluid communication with said heat pipe means so that said extension is controlled by fluid pressure produced within said heat pipe means by receipt of heat from said components, and wherein the extendable means is constructed and arranged to provide said contact pressure in the range of about 400-900 psi.

19. The apparatus of claim 18 wherein heat transfer to the heat sink is sufficient to maintain the components at a temperature in the range of about 20°-100° C. when operating at an input power of up to about 150 watts.

20. Electronic module apparatus for use in a mounting structure comprising:
   a body supporting one or more electronic components;
   thermally actuated pressure means associated with said body and in thermal communication with said components for receiving heat therefrom;
   said body having extendable means for extension therefrom into pressure contact with said mounting structure;
   said extendable means being in communication with said pressure means so that said extension is controlled by pressure produced by said pressure means upon receipt of heat from said components; and
   wherein the body is constructed and arranged to fit loosely in the mounting structure when the extendable means is in a non-extended position, the extendable means being constructed and arranged to juxtapose to the mounting structure so that said contact pressure therebetween causes the body to fit snugly in the mounting structure when the extendable means is in an extended position, and
   wherein the body comprises a planar member, the extendable means being connected to the member adjacent remote lateral edges thereof for extending outwardy from the member in a direction substantially normal to the plane thereof, the extendable means comprising interface means positioned along the respective lateral edges, said lateral edges and interface means being constructed and arranged to be loosely received between opposed surfaces of guiderails on the mounting structure when the extendable means is in a non-extended position, extension of the extendable means urging the interface means and the lateral edges into contact with said opposed surfaces under sufficient pressure to snugly hold the body in the mounting structure.

21. Electronic module apparatus for use in a mounting structure comprising:
   a body supporting one or more electronic components;
   thermally actuated pressure means associated with said body and in thermal communication with said components for receiving heat therefrom;
   said body having extendable means for extension therefrom into pressure contact with said mounting structure;
   said extendable means being in communication with said pressure means so that said extension is controlled by pressure produced by said pressure means upon receipt of heat from said components; and
   wherein the body is constructed and arranged to fit loosely in the mounting structure when the extendable means is in a non-extended position, the extendable means being constructed and arranged to juxtapose to the mounting structure so that said contact pressure therebetween causes the body to fit snugly in the mounting structure when the extendable means is in an extended position, and
   wherein the body has a portion adapted to be received between opposed surfaces of the mounting structure, said extendable means being located on said body at said portion for extension outwardly therefrom, said extendable means and said portion being constructed and arranged to be loosely received between said opposed surfaces when the extendable means is in a non-extended position, extension of the extendable means urging said extendable means and said portion into contact with said opposed surfaces under sufficient pressure to snugly hold the body in the mounting structure.

22. Electronic module apparatus comprising:
a body supporting one or more electronic components;
thermally actuated pressure means associated with said body and in thermal communication with said components for receiving heat therefrom;
a mounting structure for receiving said body;
extendable means for extension into pressure contact between the body and the mounting structure;
said extendable means being in communication with said pressure means so that said extension is controlled by pressure produced by said pressure means upon receipt of heat from said components; and
wherein the body is constructed and arranged to fit loosely in the mounting structure when the extendable means is in a non-extended position, the extendable means and the mounting structure being juxtaposed so that said contact pressure therebetween causes the body to fit snugly in the mounting structure when the extendable means is in an extended position, and
wherein the body comprises a planar member, the extendable means being positioned adjacent remote lateral edges of the member for extending outwardly from the member in a direction substantially normal to the plane thereof, the extendable means comprising interface means positioned along the respective lateral edges, said mounting structure being provided with guiderails having opposed surfaces, said lateral edges and interface means being loosely received between said opposed surfaces of the guiderails when the extendable means is in a non-extended position, extension of the extendable means urging the interface means and the lateral edges into contact with said opposed surfaces under sufficient pressure to snugly hold the body in the mounting structure.

23. Electronic module apparatus for use in a mounting structure comprising:
a body supporting one or more electronic components;
thermally actuated pressure means associated with said body and in thermal communication with said components for receiving heat therefrom;
said body having bellows for extension therefrom into pressure contact with said mounting structure;
said bellows being in communication with said pressure means so that said extension is controlled by pressure produced by said pressure means upon receipt of heat from said components;
wherein the body is constructed and arranged to fit loosely in the mounting structure when the bellows are in a non-extended position, the bellows being constructed and arranged to juxtapose to the mounting structure and connected to interface means positioned along lateral edges of the body for contact with said mounting structure and provide contact pressure therebetween in the range of about 400–900 psi which causes the body to fit snuggly in the amounting structure when the bellows is in an extended position;
and means for restricting travel of the bellows in a manner to increase fluid pressures therein.

* * * * *